United States Patent [19]

Yamaji et al.

[11] Patent Number: 4,855,807
[45] Date of Patent: Aug. 8, 1989

[54] SEMICONDUCTOR DEVICE

[75] Inventors: Yasuhiro Yamaji, Kawasaki; Kenji Takahashi, Yokohama; Seiichi Hirata, Yokosuka; Toshiharu Sakurai, Yokohama, all of Japan

[73] Assignee: Kabushiki Kaisha Toshiba, Kawasaki, Japan

[21] Appl. No.: 134,708

[22] Filed: Dec. 18, 1987

[30] Foreign Application Priority Data

Dec. 26, 1986 [JP] Japan ................................. 61-313754

[51] Int. Cl.$^4$ ...................... H01L 23/48; H01L 23/28
[52] U.S. Cl. ......................................... 357/72; 357/70; 174/52.4
[58] Field of Search ............................ 357/70, 72, 74; 174/52 FP

[56] References Cited

U.S. PATENT DOCUMENTS 4,250,347  2/1981  Fierkens ................................. 357/72

FOREIGN PATENT DOCUMENTS

| 0077160 | 6/1980 | Japan | 357/72 |
| 0079739 | 5/1983 | Japan | 357/72 |
| 0208764 | 11/1984 | Japan | 357/72 |
| 0029157 | 2/1986 | Japan | 357/72 |
| 60-208847 | 2/1986 | Japan . | |
| 0042548 | 2/1987 | Japan | 357/72 |

OTHER PUBLICATIONS

IEEE (1985), p. 192, Moisture Resistance Degradation of Plastic LSI's, by Reflow Soldering, Nanbu et al. (FIG. 9 and p. 193).
23rd Annual Proceedings of Reliability Physics 1985, Orlando, Fla., Mar. 26th-28th, 1985, pp. 192-197, IEEE, N.Y., US, I. Fukuzawa et al.: "Moisture Resistance Degradation of Plastic LSIs, by Reflow Soldering", *p. 192*.
Patent Abstracts of Japan, vol. 11, No. 7 (E-469) [2454], Jan. 9th, 1987; & JP-A-61 184 855 (OKI Electric Co. Ltd.), 08-18-1986 *Abstract*.
Patent Abstracts of Japan, vol. 10, No. 370 (E-463) [2427], Dec. 10th, 1986; & JP-A-61 166 052 (Hitachi Ltd.), 07-26-1986 *Abstract*.
Patent Abstracts of Japan, vol. 11, No. 20 (E-472) [2467], Jan. 20th, 1987; & JP-A-61 191 055 (Toshiba Corp.), 08-25-1986.

Primary Examiner—Rolf Hille
Assistant Examiner—S. V. Clark
Attorney, Agent, or Firm—Oblon, Spivak, McClelland, Maier & Neustadt

[57] ABSTRACT

This invention provides a semiconductor device comprising a die-pad supported by tie-bars, a semiconductor element mounted on the die-pad with the die-pad, tie-bars and semiconductor element being encapsulated in a moulding compound, means for defining an aperture which extends in to the moulding compound so as to expose a portion of a tie-bar.

7 Claims, 4 Drawing Sheets

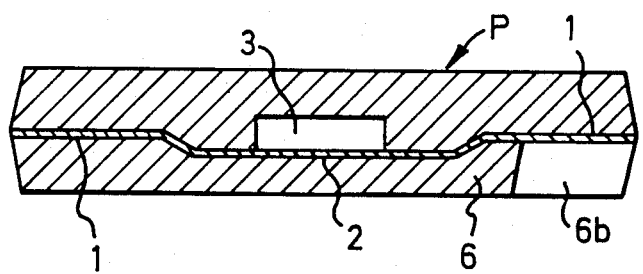
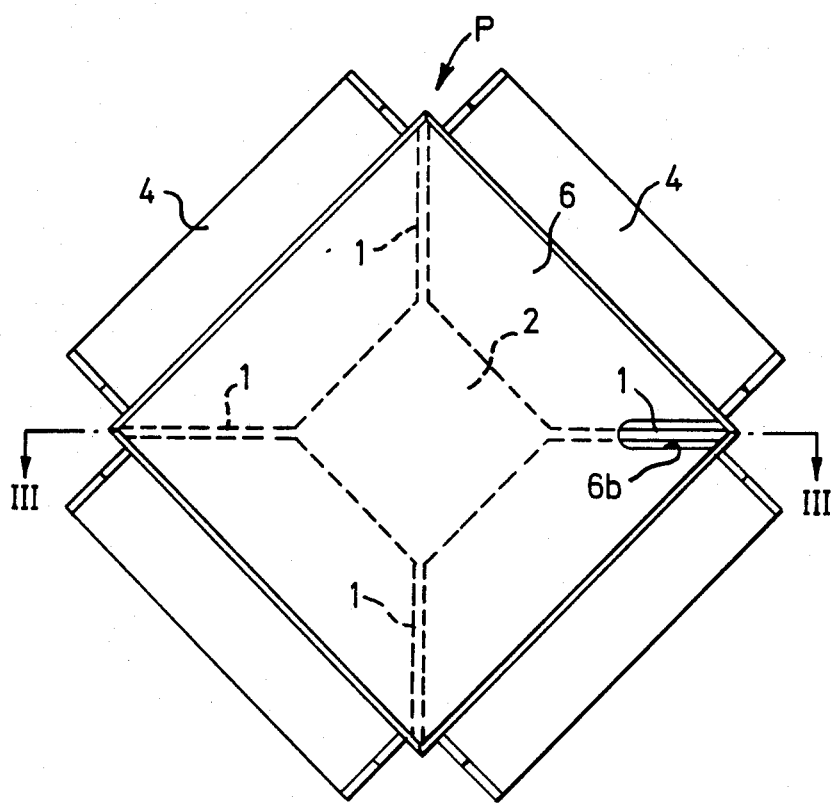

SEMICONDUCTOR DEVICE

BACKGROUND OF THE INVENTION

1. Field of the Invention

This invention relates to a semiconductor device. In particular, the invention relates to a semiconductor device suitable for surface packaging in a manner in which a number of semiconductor devices are mounted together on substrates and are encapsulated in moulding compound.

2. Description of the Related Art

In the prior art, it is the general practice, as shown in FIGS. 1 to 3, to compose a plastic-encapsulated semiconductor device for surface packaging by mounting a semiconductor element 3 on the surface of a plate-shaped die-pad 2 supported at the four corners by tie-bars 1. After bonding semiconductor element 3 and lead wires 4 by bonding wires 5, a semiconductor package P is constructed by sealing this in moulding compound 6.

At this time, the tie-bar lengths L between the corners of die-pad 2 and the ends of tie-bars 1 have values determined by the external measurements of semiconductor package P.

However, in line with recent high-density packaging, there are advances in the application of thin plastic-encapsulated packages for surface mounting such as FP (Flat Package), PLCC (Plastic Leaded Chip Carrier) and SOJ (Small Outline J-bend Package). When carrying out the surface mounting of such semiconductor packages on substrates, a method is used in which the whole of the semiconductor package is exposed to a high temperature of 200° C. or more, which is quite different from heat-soldering only the individual leads.

Because of this, the water content absorbed inside moulding compound 6 tries to vaporise explosively at the interfaces between semiconductor element 3 and moulding compound 6, and between die-pad 2 and moulding compound 6. Thus, high pressure is applied to both interfaces, so that, as shown in FIG. 3, there are problems of cracks 7 occurring in the lower part of moulding compound 6 around die-pad 2 and in the upper surface of moulding compound 6 (not illustrated) around semiconductor element 3.

Not only do these cracks 7 spoil the external appearance, they also lead to a substantial degradation of the moisture resistance reliability of semiconductor element 3.

In order to prevent the occurrence of these cracks, Japanese Laid Open Patent (Showa) 60-208847, for example, proposes methods in which columnar or polygonal holes are punched in the moulding compound at the back of the semiconductor element, to form sections with an extremely thin flash or in which there is no moulding compound. Thus, when heating the semiconductor package as a whole the gas due to vaporisation of the internal water content is allowed to escape.

However, in the method described in Japanese Laid Open Patent (Showa) 60-208847 because holes are punched in the moulding compound at the back of the semiconductor element, not only is the lower part of the die-pad, on which the semiconductor element is mounted, exposed to the outside, but when the semiconductor package as a whole is exposed to high temperature, reduction of adhesion between the moulding compound and the die-pad will occur. As a result, it is considered that there is a risk of an adverse effect on the semiconductor element due to corrosion commencing at the peeled section.

SUMMARY OF THE INVENTION

An object of this invention is to provide a semiconductor device in which, by elminating the occurrence of internal resin cracks when surface mounting, the problem of moisture resistance reliability is mitigated even when carrying out mounting using soldering by overall heating after moisture has been absorbed. Also, there should preferably be no adverse effect on the semiconductor element when using a larger size of package.

According to the present invention there is provided a semiconductor device comprising, a die-pad supported by tie-bars, a semiconductor element mounted on the die-pad with the die-pad, tie-bars and semiconductor element being encapsulated in mould in compound, and means for defining an aperture which extends into the moulding compound to expose a portion of a tie-bar.

By efficiently exhausting the water content inside the moulding compound when packaging at high temperature, the occurrence of cracks due to high pressure vapor can be prevented. In the pressent invention this is preferably achieved by exhausting the water as steam via pre-formed holes or cut-aways located in the vicinity of the interface between the moulding compound and the die-pad. Also, by preferably providing these holes or cut-aways so as to extend as far as the tie-bars, adverse effects on the semiconductor element can be prevented and it becomes possible to cope with a larger size of package.

BRIEF DESCRIPTION OF THE DRAWINGS

Embodiments of the invention will now be described by way of example only and with reference to the accompanying drawings, in which:

FIG. 4 is a cross-sectional view taken along the line I—I in FIG. 5,

FIG. 5 is a view of the underside of the embodiment,

FIGS. 6 and 7 show another embodiment of the present invention,

FIG. 6 is a cross-sectional view taken along the line III—III in FIG. 7,

FIG. 7 is a view of the underside of the second embodiment,

DETAILED DESCRIPTION OF THE PREFERRED EMBODIMENTS

Figure 1:
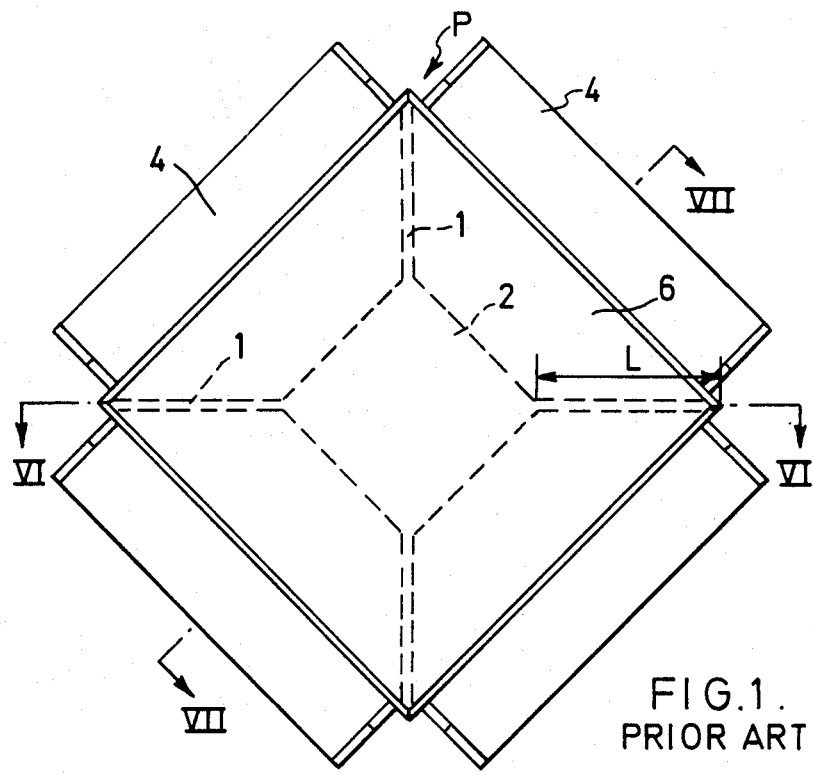
FIG. 1 is a drawing from the underside of a prior art device.
Figure 2:
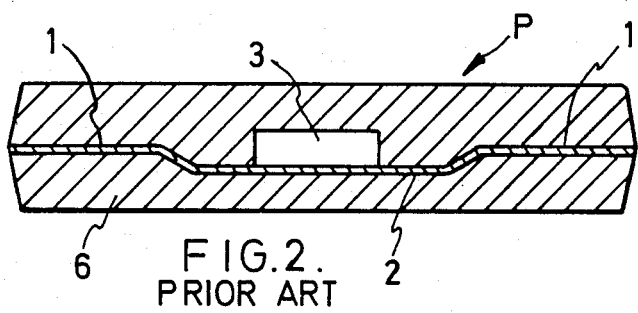
FIG. 2 is a cross-sectional view taken along the line VI—VI in FIG. 1.
Figure 3:
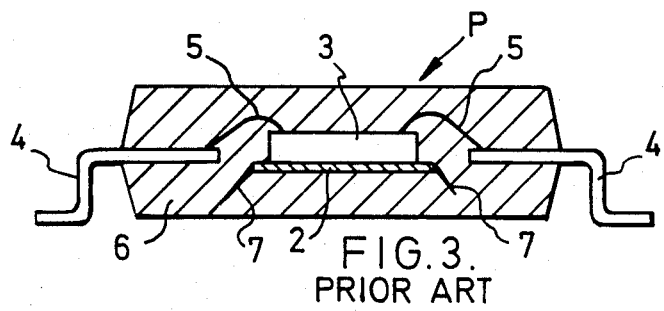
FIG. 3 is a cross-sectional view taken along the line VII—VII in FIG. 1.
Figure 4:
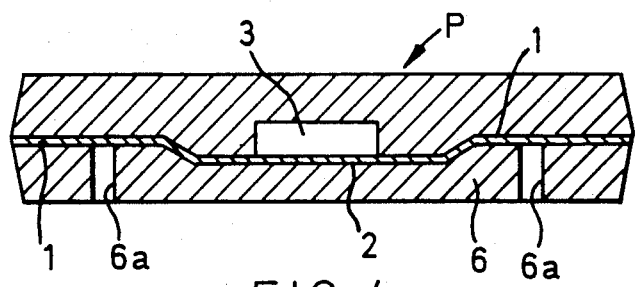
FIGS. 4 and 5 show an embodiment of the present invention.
Figure 5:
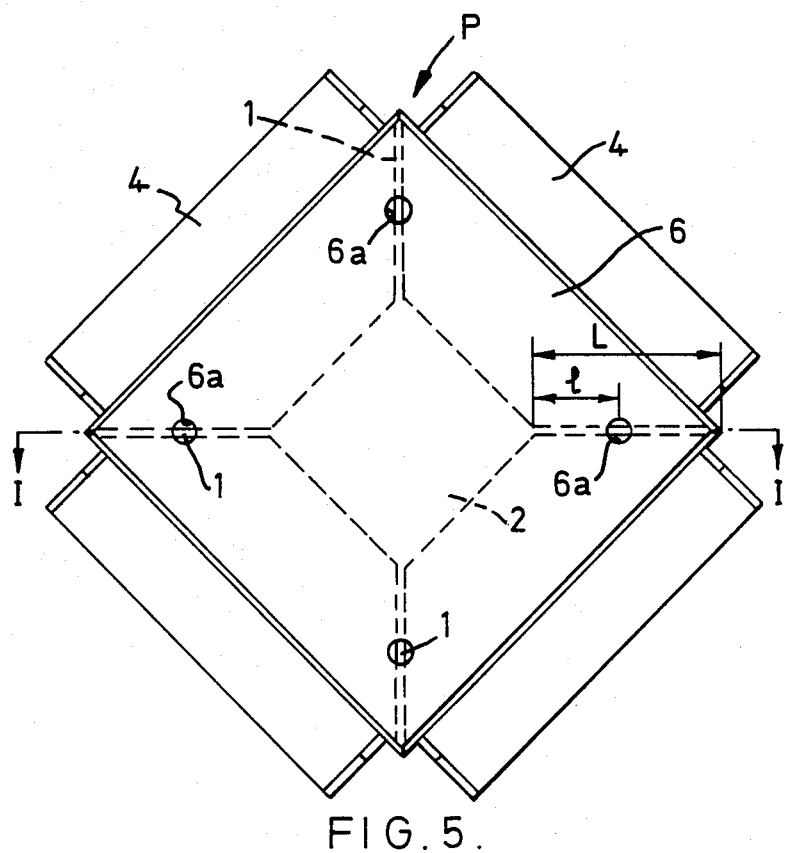

FIGS. 4 and 5 show an embodiment of this invention. The four corners of a plate-shaped die-pad 2 are supported by tie-bars 1 which extend outwardly from the corners. Semiconductor element 3 is mounted on the upper surface of die-pad 2. Semiconductor element 3 and lead wires 4 are bonded by bonding wires 5 as shown in FIG. 3.

Semiconductor package P comprises the plastic-encapsulated semiconductor element 3 and its surrounding rectangular moulding compound 6.

Holes 6a, which extend into the moulding compound 6 as far as tie-bars 1, are provided in the underside of moulding compound 6 at four positions on the diagonals defined by tie-bars 1.

When packaging the semiconductor device, the whole semiconductor package P is exposed to a high temperature, usually at least 200° C. This vaporises the water content at the interface between the semiconductor element 3 and the die-pad 3. This vapourised water is exhausted to the outside of the moulding compound via the holes 6a which expose portions of respective tie-bars 1. Thus, the occurrence of cracks in the moulding compound 6, due to the pressure of steam, is prevented.

Moreover, cracks do not normally occur at the corners since they propagate in an arc from positions corresponding to the centres of the four sides of die-pad 2. Such cracks tend to extend towards the corners and thus there is little risk of cracks actually occurring at the corners, even if holes 6a are provided there.

The distances 1 between the corners of die-pad 2 and the holes 6a are shorter than the tie-bar lengths L, the length L being determined by the external shape of the semiconductor package P. By making the semiconductor package virtually the same size as that of the area enclosed by the lines joining the holes 6a, the occurence of cracks can be prevented to a very great extent. This is because usually, the smaller the size of a semiconductor package, the less the occurrence of cracks.

Semiconductor devices constructed in this way were left in an accelerant atmosphere of 85% RH (Relative Humidity) at 85° C. until the water content in the packages was at saturation. Subsequently, the devices were dipped in "Fluorinert FC-70 (3M Company)" at 215° C. for 2 minutes and then tested. The test for occurrence of cracks revealed that no cracks had occurred in any of the 10 packages which were tested. In contrast, the result of a test in which prior art packages are treated in the same way was that cracks occurred in all 10 packages tested.

FIGS. 6 and 7 show another embodiment of the present invention. This embodiment differs from that described above in that the holes 6a are replaced by a cut-away 6b. The cut-away 6b exposes a portion of one of the tie-bars, and is open to the underside of the package. The cut-away extends inwardly from the edge of the package, part way along the length of the tie bar.

When the whole semiconductor package P is exposed to a temperature of 200° C. or more, the vaporised water content inside moulding compound 6 is exhausted via the cut-away 6b.

The reason for providing the holes 6a or cut-away 6b in the underside of moulding compound 6 is to avoid spoiling the appearance of the product. The holes 6a or cut-away 6b could also be provided in the upper surface of the moulding compound 6.

A further improvement in moisture resistance reliability can be achieved by applying junction coating resin (JCR) or polyimide on the surface of semiconductor element 3.

Moreover, it is possible to provide at least one hole 6a or one cut-away 6b on one diagonal defined by tie-bars 1.

Figure 8:
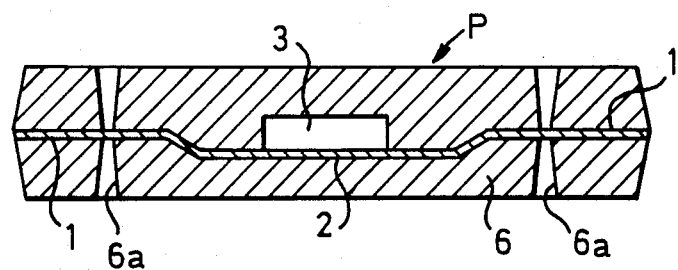
FIG. 8 is a cross-sectional view of a further embodiment of the present invention.

FIG. 8 shows a further embodiment of the present invention. This embodiment differs from those described above by the use of tapered holes 6a to penetrate the and expose a portion of respective tie-bars. Each of these holes 6a becomes gradually narrower towards the respective tie-bar 1. Also, the tapered holes 6a are provided in both surfaces of the 6.

Prior to the die-pad 2 and semiconductor element 3 being encapsulated in the moulding compound 6, the tie-bars 1 and the die-pad 2 are usually fixed by a mould die (not shown). The mould-die has shaped projections which match the configuration of the tapered holes 6a. The projections prevent the die-pad 2 from tilting, the thickness of the moulding compound over semiconductor element 6 from changing, and unnecessary forces from occurring.

It is easy to separate the semiconductor package P from the mould-die, because the shape of the each projection is a tapered column which becomes gradually narrower towards the end point.

Also, an improvement of the moisture resistance reliability after surface mounting can be achieved by providing at least two tapered holes 6a on both surfaces of the moulding compound 6, these two holes 6a being positioned along a diagonal of the square semiconductor package P and exposing portions of respective tie-bars. Moreover, it is preferred to provide four or eight holes 6a on both surfaces of the moulding compound 6, these four or eight holes positioned along two diagonal of the square semiconductor package.

Figure 9:
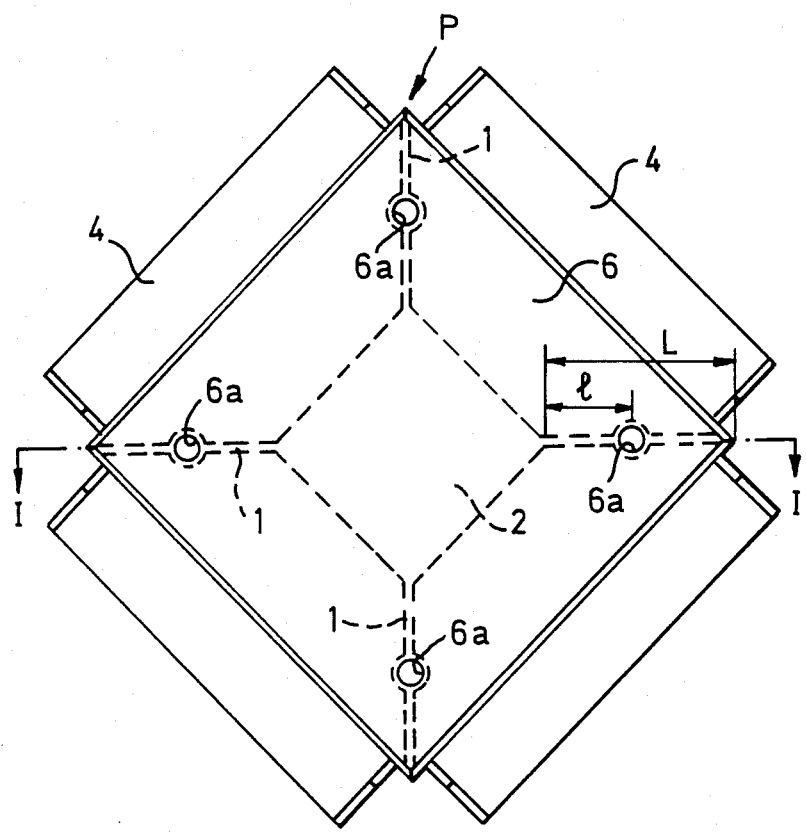
FIG. 9 is a view of either the upper or underside of the still further embodiment, the view from both of these sides being the same.

FIG. 9 shows a further embodiment of the present invention. This embodimemt differs from those described above in that the exposed portion of the tie-bar 1 is a circle shaped portion of the tie-bar. Each hole 6a is concentric with the respective circle shaped portion, the area of which is larger than that of hole 6a.

With this arrangement, the probability of mis-locating the tie-bars 12 with the respective protrusions of the mould-die will be reduced.

Again, with the above construction, when the whole semiconductor package is exposed to a high temperature (of at least 200° C.) for surface mounting, the water content inside the moulding compound vaporises and is easily exhausted from the package. Hence, the occurrence of cracks due to high pressure vapor can be prevented. The diameter of the hole is also formed very narrow, for example, it is 0.5 mm. Thus the narrow hole prevents solder from entering into the package.

Moreover, even in large-sized semiconductor packages, the occurrence of cracking is prevented in the same way as that of smaller semiconducter packages by the provision of the aperture or cut-away. Consequently, reliability can be improved.

Furthermore, since the underside of the die-pad on which the semiconductor element is mounted is not exposed, there is no risk of corrosion. Also, since only narrow tie-bars connect the holes to the die-pad, penetration of contaminants from outside the package to the semiconductor elements can be inhibited. Consequently, there is no adverse effect on the semiconductor element due to the holes.

Various modifications can be made to the described embodiments without departing from the scope of the invention.

What is claimed is:

1. A semiconductor device comprising:
a die-pad supported by a plurality of tie-bars;

a semiconductor element mounted on the die-pad with the die-pad, tie-bars and semiconductor element being encapsulated in moulding compound; and means for defining at least one aperture which each extends from a surface of said moulding compound into said moulding compound so as to expose a portion of a respective one of said tie-bars.

2. A semiconductor device as claimed in claim 1, wherein the defining means is formed as a hole.

3. A semiconductor device as claimed in claim 1, wherein the defining means is in the form of a cut-away open to the underside and one lateral edge of the moulding compound.

4. A semiconductor device as claimed in claim 1, wherein said exposed portion of said tie-bar is part of a shaped area of the tie-bar which is larger than the cross-section of the aperture.

5. A semiconductor device as claimed in claim 1, wherein at least two apertures extend into the moulding compound so as to expose a portion of two respective tie-bars.

6. A semiconductor device as claimed in claim 1, wherein at least two apertures extend in both the underside and the upperside of the moulding compound, with the apertures extending into the moulding compound so as to expose respective portions of tie-bars.

7. A semiconductor device as claimed in claim 1, wherein the portion of the tie-bar adjacent the exposed portion of the tie-bar is smaller in surface area than is the exposed portion of the tie-bar.

* * * * *